United States Patent [19]

Egashira et al.

[11] 3,951,728

[45] Apr. 20, 1976

[54] METHOD OF TREATING SEMICONDUCTOR WAFERS

[75] Inventors: Etsuo Egashira; Shinichiro Miyoshi, both of Yamanashi; Yukio Takei, Hachioji; Masato Fujita, Yamanashi, all of Japan

[73] Assignee: Hitachi, Ltd., Japan

[22] Filed: July 30, 1974

[21] Appl. No.: 493,106

[52] U.S. Cl. ............................ 156/600; 29/580; 156/16; 156/17; 156/610
[51] Int. Cl.² ............... H01L 21/20; H01L 21/302
[58] Field of Search ............ 156/6, 17, 11, 16, 345, 156/600, 610; 29/580, 581, 583; 134/3, 33; 148/187, 175

[56] References Cited
UNITED STATES PATENTS

| | | |
|---|---|---|
| 3,325,392 | 6/1967 | Rummel ............................ 156/610 |
| 3,421,962 | 1/1969 | Topas ............................... 156/345 |
| 3,438,809 | 4/1969 | Kaueggia et al. ..................... 156/17 |
| 3,657,004 | 4/1972 | Merkel et al. ....................... 156/610 |
| 3,679,517 | 7/1972 | Schulten et al. ...................... 156/17 |
| 3,756,876 | 9/1973 | Brown et al. ......................... 156/17 |
| 3,762,945 | 10/1973 | DiLorenzo............................ 156/17 |
| 3,808,065 | 4/1974 | Robinson et al..................... 156/345 |

*Primary Examiner*—William A. Powell
*Assistant Examiner*—Jerome W. Massie
*Attorney, Agent, or Firm*—Craig & Antonelli

[57] ABSTRACT

A method of treating wafers, wherein a plurality of wafers are stacked and immersed in an etchant, to work, i.e., etch, the peripheral surfaces of the wafers. Sliced semiconductor wafers or metallic or ceramic wafers can be chemically chamfered in this manner.

17 Claims, 15 Drawing Figures

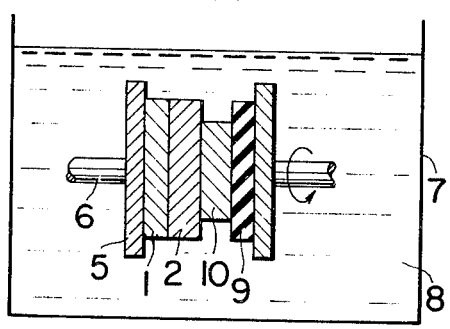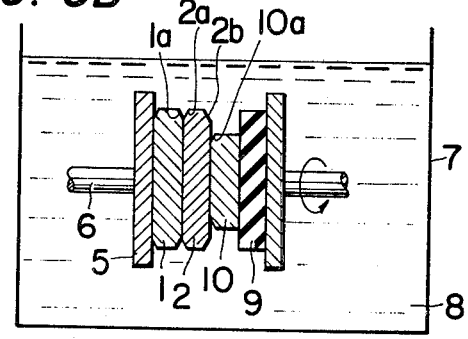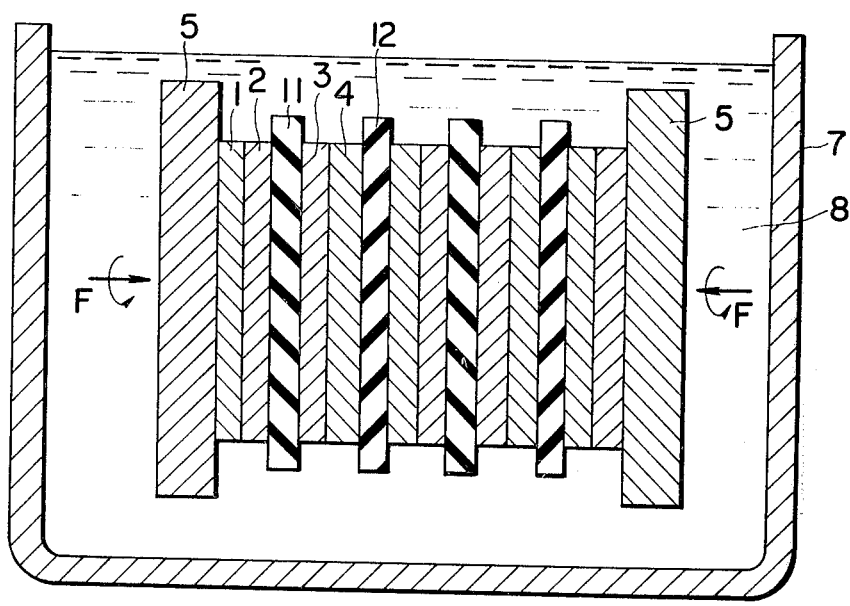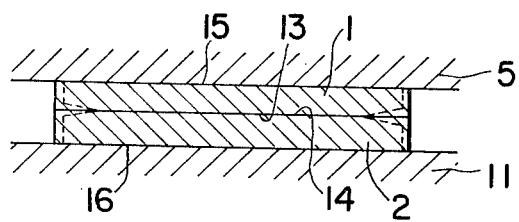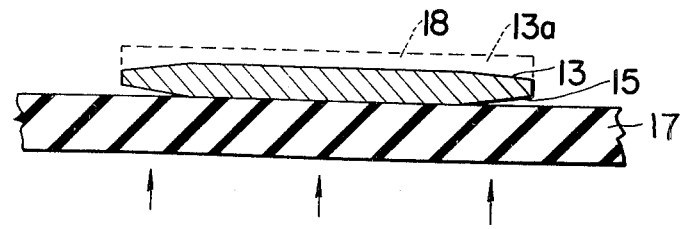

METHOD OF TREATING SEMICONDUCTOR WAFERS

BACKGROUND OF THE INVENTION

1. Field of the Invention

The present invention relates to a method of chamfering semiconductor wafers, and more particularly to the prevention of the occurrence of working distortions at the peripheral parts or portions of the wafers.

2. Description of the Prior Art

In the manufacture of a semiconductor device such as transistor and IC, a variety of treatments for forming elements are made wherein a single crystal semiconductor ingot is sliced and worked into semiconductor wafers by means of a diamond cutter or the like. Crystal distortions etc. are prone to arise at the surface and peripheral parts of the wafers due to the slicing operation.

Mechanical polishing or chemical polishing is therefore carried out for the surface of the semiconductor wafers obtained by the slicing. In the polishing, however, it is often the case that chips, crystal distortions and crystal defects are brought about particularly on the peripheral parts of the semiconductor wafers. The chips seem to be ascribable to the fact that although the semiconductor wafer is very hard, it is fragile, and the fact that stresses are concentrated on the peripheral part of the wafer during the polishing operation.

In polishing the semiconductor wafer, only the peripheral parts were previously treated with sandpaper etc. as a trial. Even by this trial procedure, the chips, distortions and crystal defects could not be eliminated.

Where a semiconductor layer was formed by epitaxial growth on such wafer, the temperature was more easily raised and a reaction gas pervaded more at the peripheral wafer than at the central part of the wafer. As a result, the growth rate became larger at the peripheral parts than at the central part, and a thicker layer called the crown was formed.

With the treatment by such mechanical means, the distortions due to the working appear at the peripheral wafer parts, and minute cracks appear. A further disadvantage is that the chipping of the peripheral parts of the wafer tends to arise during the working. Where the epitaxially grown layer is formed on the surface of the semiconductor wafer subjected to such working, the distortions and defects at the working affect the epitaxially grown layer, to disadvantageously cause slip lines and stacking faults.

These disadvantages seem to come from the fact that, with the treating method which employs the sand paper, working distortions are brought about or arise within the peripheral parts of the semiconductor wafer anew during this treatment.

In any event, it has been revealed that the mechanical method using the sandpaper or the like in the treatment of the semiconductor wafer is unsuitable.

Besides, the prior-art method of mechanical treatment works the wafers one by one, and is limited in the number of wafers which it can treat. When it is intended to treat many wafers, the equipment becomes large and the job efficiency becomes very inferior.

SUMMARY OF THE INVENTION

It is accordingly an object of this invention to provide a treatment method for wafers which does not bring about any working distortion to the peripheral parts of the wafers.

Another object is to provide a treatment method for semiconductor wafers through which good epitaxial layers can be formed thereon.

Still another object is to provide a treatment method for semiconductor wafers which can simultaneously treat a plurality of wafers.

One embodiment of the present invention for accomplishing the objects lies in a method of chamfering semiconductor wafers, and is characterized by the steps of stacking a plurality of wafers and immersing them in an etchant so as to cause working, i.e., etching of the outer peripheral surfaces of the wafers.

Another embodiment of the present invention is characterized by comprising the steps of stacking at least two semiconductor wafers in such a manner that first principal planes of the respective semiconductor wafers oppose each other, etching the exposed surfaces of the semiconductor wafers in such a manner that corrosion-proof objects are closely contacted with second principal planes of the respective semiconductor wafers so as to cover the second principal planes, and heating the etched and chamfered semiconductor wafers in such a manner that the second principal plane of each of the semiconductor wafers is closely contacted with a surface of a heating body.

Still another embodiment of the present invention is a variation of the second-mentioned embodiment, and is characterized in that a semiconductor layer is formed by epitaxial growth on the first principal plane of the semiconductor wafer during the heat treatment step.

With the embodiments stated above, this invention can accomplish the foregoing objects.

More specifically, any working distortion is not brought about anew to the wafers during the etching treatment. On the other hand, the etching rate is low at parts at which the contact and circulation of the etchant are loose or gentle.

In the case where the plurality of wafers are stacked, the etchant acts well on the peripheral surfaces of the wafers, whereas it is restricted in acting on the principal planes of the wafers. It is accordingly possible to execute the working treatment of the outer peripheral surfaces of the wafers even by the etching method. In this case, an etching mask made of wax, photoresist or the like need not be especially used during the working treatment.

In case of the wafers, particularly the semiconductor wafers, the thickness is usually as small as 0.3 to 0.5 mm or so. Accordingly, the working treatment in this invention can simultaneously treat several hundreds of semiconductor wafers at one time.

While this invention is effective particularly in the treatment of the semiconductor wafers, the case of applying it to the semiconductor wafers will be explained in the following description of embodiments taken in conjunction with the accompanying drawings, wherein:

BRIEF DESCRIPTION OF THE DRAWINGS

FIGS. 5A and 5B are views which show the respective states of wafers before and after subjecting the wafers to selective etch working by the fourth embodiment of the method of working wafers according to the present invention;

FIGS. 6 to 8 illustrate the aspects of treatment in another embodiment of the present invention, among which FIG. 6 is a vertical sectional view at the working treatment, FIG. 7 is a sectional view of a part at the working treatment and FIG. 8 is a vertical sectional view at a heat treatment; and FIG. 9 is a vertical sectional view at a heat treatment in the case where a wafer treated by a prior-art method is used.

PREFERRED EMBODIMENTS OF THE INVENTION

Embodiment 1

Figure 1A:
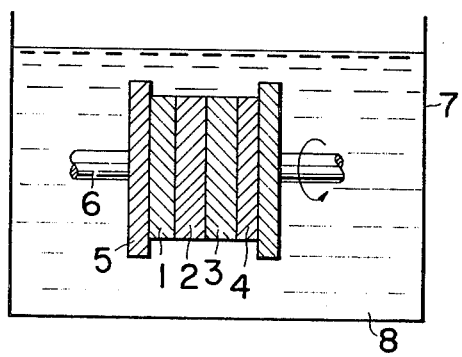
FIGS. 1A and 1B are views which show the respective states or conditions of wafers before and after subjecting the wafers to etch working by the first embodiment of a method of working wafers according to the present invention.
Figure 1B:
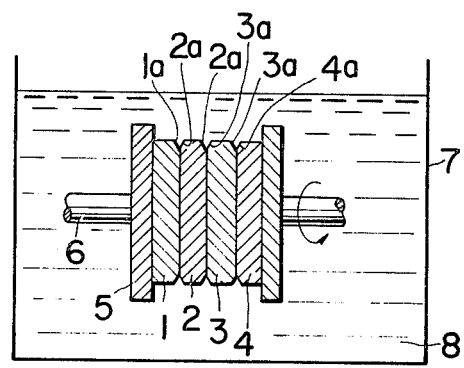
Figure 2A:
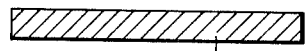
FIGS. 2A, 2B and 2C are views which show the state or condition of the wafer to-be-worked after slicing, the state after the first etching and the state after the second etching, respectively.

FIGS. 1A and 1B illustrate the respective states or conditions of wafers before and after etching and working the wafers by the first embodiment of the method for working wafers according to the present invention. In the figures, numerals 1, 2, 3 and 4 designate wafers made of silicon, germanium, intermetallic compounds, etc. to be worked and treated as obtained from an identical ingot by slicing. As shown in FIG. 2A, the wafer has square corners at its peripheral parts. First of all, the respective wafers 1 to 4 are stacked, and are fixed by fixing plates 5, of for example vinyl chloride, so as to press a pressure from 0.3 to 1.0 Kg/cm². Subsequently, the wafers 1 to 4 made into an integral unit are immersed in a liquid etchant 8 of a mixture of hydrofluoric acid, nitric acid and acetic acid by a volume ratio of 1:3:2, or hydrofluoric acid and nitric acid by volume ratio of 1:19 filled in a container 7.

Figure 2B:
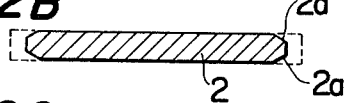
Figure 2C:
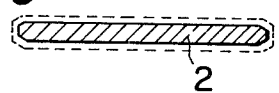

In order that the peripheral parts of the respective wafers 1 to 4 may be uniformly immerged in the etchant 8 and that they may have the liquid pressure uniformly exerted thereon, a rotary shaft assembly 6, of for example vinyl chloride, coupled to the fixing plates 5 is rotated at, for example, 10 to 60 rpm in the direction of an arrow as in FIG. 1A during the immersion. In this case, the inclination of the rotary shaft 6 is made arbitrary by the method of agitation. Under this state, the peripheral parts (i.e. outer edge portions) of the wafers 1, 2, 3 and 4 are etched. Herein, the etchant 8 permeates into some clearances between wafers, namely between the wafers 1 and 2, between wafers 2 and 3 and between wafers 3 and 4. After a predetermined period of time e.g. from 1 to 5 minutes chamfered or etched surfaces 1a, 2a, 3a and 4a are formed at the respective peripheral parts of the wafers 1, 2, 3 and 4 as illustrated in FIG. 1B and FIG. 2B. At the next stage, the etching treatment over the entire area of the wafer is carried out for the wafers 1 to 4 in a mixture of hydrofluoric acid, nitric acid and acetic acid by volume ratio of 1:3:2 of the same etchant. As a result, the wafer is reduced by about 20 to 80μ in thickness. Then, the peripheral wafer parts have squariness removed and become round as illustrated in FIG. 2C by numeral 2. Thereafter, the wafer is subjected to the lap finishing and further reduced by about 20 to 40μ. In consequence, the wafer having 300 to 400μ thickness is obtained.

Embodiment 2

Figure 3A:
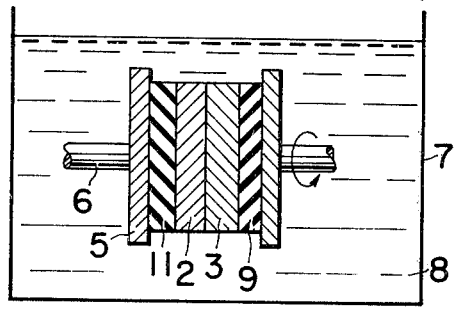
FIGS. 3A and 3B are views which show the respective states of wafers before and after subjecting the wafers to etch working by the second embodiment of the method of working wafers according to the present invention.
Figure 3B:
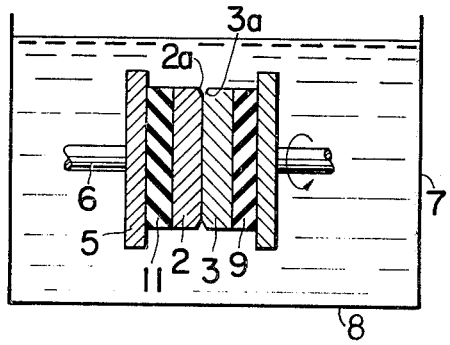

FIGS. 3A and 3B illustrate the respective states or conditions of wafers before and after etching and working the wafers by the second embodiment of the method of working wafers according to the present invention. In FIG. 3A, numerals 2 and 3 indicate wafers of silicon, germanium, intermetallic compounds etc. obtained by slicing a semiconductor ingot, while numerals 9 and 11 denote elastic rubber, e.g. silicone rubber or resin plates, e.g. vinyl chloride plates which have the same geometry as that of the wafers 2 and 3 or which are somewhat larger than them. First, the wafers 2 and 3 are stacked along with the rubber plates 9 and 11, and are fixed by the fixing plates 5. Subsequently, the wafers 2 and 3 are immersed in the etchant 8 (i.e. the same as the above mixture) received in the container 7. Subsequently, likewise to the previous embodiment, the rotary shaft 6 is rotated as illustrated in FIG. 3A. Under this state, the peripheral parts of the wafers 2 and 3 are etched. As shown in FIG. 3B, chamfered or etched surfaces 2a and 3a are formed at the peripheral parts.

A clearance of such extent that the etchant 8 permeates thereinto is not defined between the wafer 3 and the rubber 9, so that the surface of the wafer 3 on the side on which it is in contact with the rubber 9 is not formed with any chamfered surface. The same applies between the wafer 2 and the rubber 11.

Embodiment 3

Figure 4A:
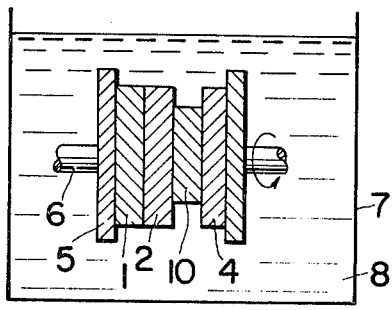
FIGS. 4A and 4B are views which show the respective states of wafers before and after subjecting the wafers to selective etch working by the third embodiment of the method of working wafers according to the present invention.
Figure 4B:
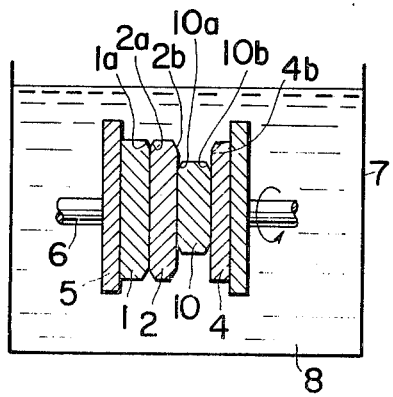

FIGS. 4A and 4B illustrate the respective states or conditions of wafers before and after being subjected to the selective etching of the third embodiment of the method of working wafers according to the present invention. In FIG. 4A, numerals 1, 2 and 4 represent wafers (made of silicon, germanium, intermetallic compounds, etc.) of the same diameter, and numeral 10 a wafer smaller in diameter than the wafers 1, 2 and 4. As illustrated in FIG. 4A, the wafers 1, 2, 4 and 10 are stacked and fixed by the fixing plates; the plates are immerged in the etchant 8 in the container 7; and the rotary shaft 6 is rotated. Then the peripheral parts of the wafers 1, 2, 4 and 10 are etched. At this time, the etchant 8 permeates into some clearances between the wafers 1 and 2, between wafers 2 and 10 and between wafers 10 and 4. After a predetermined period, a chamfered surface 1a, chamfered surfaces 2a and 2b, a chamfered surface 4b and chamfered surfaces 10a and 10b are formed at the respective peripheral parts or portions of the wafers 1, 2, 4 and 10.

Since the peripheral parts of the surfaces of the wafers 2 and 4 on the sides on which they lie in contact with the wafer 10 are larger in the area contacted with the etchant as compared with those of the remaining wafer surfaces, the chamfered surfaces 2b and 4b occupy larger areas and have gentler inclinations than the chamfered surfaces 1a, 2a and 10a

Embodiment 4

FIGS. 5A and 5B illustrate the respective states or conditions of wafers before and after being subjected to the selective etching of the fourth embodiment of the method of working wafers according to the present invention.

In FIG. 5A, numerals 1 and 2 designate wafers made of silicon, germanium, intermetallic compounds, etc. and reference numeral 10 refers to a wafer smaller in diameter than the wafers 1 and 2. The elastic rubber plate 9, made of silicone rubber, has the same geometry as the wafers 1 and 2. The wafers 1, 2 and 10 are stacked along with the rubber 9, and are fixed by the fixing plates 5. The plates and wafers are immersed in the etchant 8, and the rotary shaft 6 is rotated. The peripheral parts of the wafers 1, 2 and 10 are etched. After a predetermined period of time, a chamfered surface 1a, surfaces 2a and 2b and a chamfered surface 10a are formed at the peripheral parts of the respective wafers 1, 2 and 10 as illustrated in FIG. 5B.

The peripheral parts of the surface of the wafer 2 on the side on which it lies in contact with the wafer 10 is larger in the area contacted with the etchant than the other wafer surfaces, so that the chamfered surface 2b becomes greater in area and gentler in inclination than the chamfered surfaces 1a, 2a and 10a. Since the etchant 8 does not permeate between the wafer 10 and the rubber 9, the surface of the wafer 10 as is held in contact with the rubber 9 is not formed with any chamfered surface.

Although, in each of the embodiments, the wafers are fixed by the fixing plates 5 and thereafter immersed in the etchant 8, a pad or fibrous member impregnated with the etching solution may be laid on the side surfaces of the wafers after fixing them by the fixing plates. In this case, the etching of the peripheral wafer parts is performed more stably.

As stated above, in the working methods of Embodiments 1 to 4, the stacked wafers are individually separate, and some clearance is existent between the adjacent wafers. The etchant therefore enters into the interstice or space between wafers. In consequence, the chamfered surfaces are created at the peripheral wafer parts, the working distortions introduced to the peripheral wafer parts by the slicing are removed, and the treatment can be made well. Since cracks as well as the working distortions can be removed by turning the peripheral wafer parts into the chamfered surfaces, the peripheral wafer parts are not chipped, and hence, the flawing of the semiconductor surfaces due to chips does not occur. Since the working distortions of the peripheral parts of the wafer are eliminated, wafers having high quality of epitaxially grown layers can be produced. In case of the lapping, a liquid etchant can also be used, and the wafers can be lapped by only the chemical action. For this reason, the treatment based on the mechanical action as is apt to bestow distortions on the wafers may be avoided. The invention has such merits.

Embodiment 5

FIG. 6 illustrates the aspect of a working process for semiconductor wafers according to the fifth embodiment of the present invention. In this figure, reference numerals 1, 2, 3, 4 . . . indicate silicon semiconductor wafers to be treated, while numerals 11 and 12 designate acid-proof sheets made of, for example, a fluoride resin such as Teflon, (trademark) i.e. polytetrafluoroethylene, or polyvinyl chloride. Every two semiconductor wafers 1 and 2, and 3 and 4 are placed on each other, and they are pressed from both the sides and fixed by the acid-proof sheets 11 and 12 and the fixing plates 5. Under this state, they are immersed in the etching solution 8, for example, a solution of (nitric acid):(fluoric acid) = 1:6 or 1:5 (volume ratio) in the container 7. The fixing plates 5 are pressed from both the sides by, for example, pressure springs (not shown). As the etchant is suitably being agitated, the exposed side surfaces of the wafers are etched and chamfered. At this time, as illustrated in FIG. 6, the respective semiconductor wafers 1 and 2 are stacked in such a manner that the first principal planes 13 and 14 on which epitaxial layers are to be formed are opposed and that the resin sheet 11 and the fixing plate 5 are laid on the other principal planes (the second principal planes) 15 and 16 so as to fully cover them.

By accumulating the combinations between the semiconductor wafers and the resin sheet in this case, the working of a great plurality, i.e., several tens to several hundreds of wafers, is possible at the same time.

The wafers are etched by the chamfered working so that only the opposing first principal planes 13 and 14 may have slant or chamfered surfaces as shown by dotted lines in FIG. 7.

Thereafter, the wafers 1, 2, 3 and 4 are disjoined, and the chamfered side is made a mirror surface by etching or polishing. Then, epitaxial substrate wafers are finished. As illustrated in FIG. 8, the substrate wafer thus obtained is put on a susceptor (heating body) 17 of epitaxial growth apparatus in a manner that the chamfered side 13 faces upwards, and it is heated in a high-frequency heating furnace so as to form an epitaxially grown semiconductor layer 18 of for example silicon, germanium, intermetallic compounds, etc. (shown by broken lines) thereon. For example, the epitaxial treatment is effected for 30 to 120 minutes at 1100°C, thereby to obtain about 5 to 20$\mu$ of epitaxial silicon layer.

According to the construction of the present invention as described in the above embodiment, various advantages as stated below are achieved.

a. Regarding the surfaces of the wafers on the side on which they are placed on each other, the peripheral parts of the wafer are etched and simultaneously the corner parts of the wafers are etched earliest at the etching as illustrated in FIG. 7. The etchant permeates through the interstice between the stacked wafers little by little. Therefore, the working treatment by the etching action becomes possible.

b. Regarding the side on which the wafer is in contact with the resinous sheet, the corrosion-proof sheet is closely stuck onto the wafer surface and perfectly covers it. Consequently, the permeation of the etchant is checked, and only the etching of the side wafer surface proceeds.

c. On the basis of the item (b), the back of the semiconductor wafer is not worked and chamfered, so that the wafer does not float from the heating body surface. Accordingly, no temperature gradient appears in the semiconductor wafer, and the thermal stress etc. do not arise. A uniform epitaxially-grown semiconductor layer free from crystal defects such as the so-called slip line is therefore obtained.

d. As understood from FIG. 6, the working treatment of several tens to several hundreds of semiconductor wafers can be simultaneously made.

e. Since a mechanical working equipment is unnecessary, maintenance and inspection become very simple. In addition, the investment of equipment is very small.

Besides the foregoing embodiment, the present invention can have the aspects of performance as stated below.

1. In order to make the worked shape of the semiconductor wafer still better, treatment can be carried out in such a way that the side surface of the semiconductor wafer is rubbed by belt or cloth of a synthetic fiber either in the etchant or under the state under which it is impregnated with the etchant.

2. The keeper plates at both extremities are provided with a shaft assembly, and the wafers in the etchant are rotated by the shaft assembly. Thus, the agitation effect can be enhanced, and the etching treatment time can be shortened.

In the wafers obtained according to the present invention, the wafers having only one chamfered side such as wafers 2 and 3 in FIG. 3B are especially effective when applied to the working treatment of semiconductor wafers for the eptiaxial growth due to the flatness of the bottom face to be put on the susceptor. However, other types of wafers are also applicable thereto.

While the novel embodiments of the invention have been described, it will be understood that various omissions, modifications and changes in these embodiments may be made by one skilled in the art without departing from the spirit and scope of the invention.

What is claimed is:

1. A method of chamfering wafers, comprising the steps of providing a plurality of semiconductor wafers each having principal planes and peripheral parts with edge portions therebetween, stacking the plurality of wafers with the principal planes of adjacent wafers contacting each other, and immersing the wafers in an etchant to etch the peripheral parts and the edge portions of said wafers whereby etched and chamfered surfaces are formed between exposed peripheral parts of adjacent wafers without effecting etching of said principal planes of said wafers which contact each other.

2. A method of treating semiconductor wafers, comprising the steps of providing at least one group of two semiconductor wafers each having first and second principal planes with peripheral parts defining edge portions therebetween, stacking every group of two semiconductor wafers in such a manner that the first principal planes of the semiconductor wafers are positioned opposite to and in contact with each other, etching the exposed surfaces of the peripheral parts of said semiconductor wafers in such an arrangement that corrosion-proof elements are closely contacted with the second principal planes of said respective semiconductor wafers of each group to cover said second principal planes and to contact the peripheral parts of the wafers with an etchant and heating the resultant etched and chamfered semiconductor wafers in such a manner that said second principal plane of each semiconductor wafer is closely contacted with a surface of a heating body and that an epitaxially grown semiconductor layer is formed on said first principal plane of each semiconductor wafer.

3. The method of claim 2, wherein said semiconductor wafers are made of silicon, germanium or intermetallic compounds and the etchant is one selected from the group consisting of a mixture of hydrofluoric acid, nitric acid and acetic acid, and of hydrofluoric acid and acetic acid.

4. The method of claim 2, wherein the corrosion-proof elements and plates pressed against the wafers by a pressure of from 0.3 to 1.0 $Kg/cm^2$.

5. The method of claim 2, wherein the corrosion-proof elements are made of polytetrafluoroethylene or polyvinyl chloride.

6. The method of claim 1, wherein said semiconductor wafers are made of silicon, germanium or intermetallic compounds and the etchant is one selected from the group consisting of a mixture of hydrofluoric acid, nitric acid and acetic acid, and of hydrofluoric acid and nitric acid.

7. The method of claim 1, wherein the wafers are pressed together under a pressure of from 0.3 to 1.0 $Kg/cm^2$ and are rotated at a speed of 10 to 60 rpm while totally immersed in said etchant.

8. The method of claim 1, wherein the etchant permeates between adjacent stacked wafers to form said chamfered surfaces on the peripheral portions of each of said adjacent wafers.

9. The method of claim 1, wherein said plurality of wafers are pressed together between a pair of fixing plates, each plate contacting one principal plane of a semiconductor wafer positioned at the end of said stack whereby said one principal plane is masked from said etchant.

10. The method of claim 1, wherein said plurality of wafers are pressed together between a pair of fixing plates, at least one of said plates contacting an etchant-resistant element, said etchant-resistant element contacting one principal plane of a semiconductor wafer positioned at the end of said stack whereby said one principal plane is masked from said etchant by said etchant-resistant element.

11. The method of claim 1, wherein said etchant is an acid etchant and each of said wafers is a semiconductor wafer.

12. The method of claim 1, wherein said plurality of wafers are each identical in size whereby the chamfered surfaces each has the same inclination with respect to the principal planes of said wafers.

13. The method of claim 1, wherein one of said plurality of wafers is smaller than the wafers adjacent thereto whereby the chamfered surfaces formed on the wafers contacting said one wafer have a greater inclination than the chamfered surfaces formed on the other wafers.

14. The method of claim 1, wherein the principal planes of each wafer are parallel and the peripheral parts form corner edges therebetween.

15. The method of claim 2, wherein said etchant is an acid etchant.

16. The method of claim 1, wherein each of said wafers has two principal planes which define the major surfaces of said wafer, said peripheral parts being perpendicular to each of said major surfaces and the edge portions being defined by the peripheral parts and the major surface.

17. The method of claim 1 further comprising removing the plurality of wafers from the stacked arrangement and thereafter immersing the individual wafers in an etchant to etch the entire area of each wafer whereby each wafer is reduced in thickness, and the peripheral parts of said wafers become round.

* * * * *